(12) United States Patent
Harada et al.

(10) Patent No.: US 11,170,483 B2
(45) Date of Patent: Nov. 9, 2021

(54) SAMPLE OBSERVATION DEVICE AND SAMPLE OBSERVATION METHOD

(71) Applicant: Hitachi High-Technologies Corporation, Tokyo (JP)

(72) Inventors: Minoru Harada, Tokyo (JP); Yuji Takagi, Tokyo (JP); Naoaki Kondo, Tokyo (JP); Takehiro Hirai, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/718,264

(22) Filed: Dec. 18, 2019

(65) Prior Publication Data

US 2020/0126201 A1    Apr. 23, 2020

Related U.S. Application Data

(63) Continuation of application No. 15/898,366, filed on Feb. 16, 2018, now Pat. No. 10,559,074.

(30) Foreign Application Priority Data

Feb. 20, 2017 (JP) ................................. 2017-029011

(51) Int. Cl.
*G06T 5/50* (2006.01)
*G06T 5/00* (2006.01)
(Continued)

(52) U.S. Cl.
CPC ................ *G06T 5/50* (2013.01); *G06T 5/003* (2013.01); *G06T 7/001* (2013.01); *G06T 7/0008* (2013.01);
(Continued)

(58) Field of Classification Search
USPC ........................................................ 348/80
See application file for complete search history.

(56) References Cited

U.S. PATENT DOCUMENTS

2007/0031026 A1    2/2007   Kurihara et al.
2012/0128238 A1    5/2012   Kameyama
(Continued)

FOREIGN PATENT DOCUMENTS

JP    2001-189358 A    7/2001
JP    2007-040910 A    2/2007
(Continued)

OTHER PUBLICATIONS

Dong Chao, et al. "Image Super-Resolution Using Deep Convolutional Networks," arXiv:1501.00092v3 [cs.CV] Jul. 31, 2015.

*Primary Examiner* — Jeffery A Williams
(74) *Attorney, Agent, or Firm* — Mattingly & Malur, PC

(57) ABSTRACT

A sample observation device images a sample placed on a movable table by irradiating and scanning the sample with a charged particle beam of a microscope. A degraded image having poor image quality and a high quality image having satisfactory image quality which are acquired at the same location of the sample by causing the charged particle microscope to change an imaging condition for imaging the sample are stored. An estimation process parameter is calculated for estimating the high quality image from the degraded image by using the stored degraded image and high quality image. A high quality image estimation unit processes the degraded image obtained by causing the charged particle microscope to image the desired site of the sample by using the calculated estimation process parameter. Thereby, the high quality image obtained at the desired site is estimated, and then the estimated high quality image is output.

13 Claims, 13 Drawing Sheets

(51) Int. Cl.
  *G06T 7/00* (2017.01)
  *H01J 37/22* (2006.01)
  *H01J 37/20* (2006.01)
  *H01J 37/28* (2006.01)

(52) U.S. Cl.
  CPC ............ *H01J 37/20* (2013.01); *H01J 37/222* (2013.01); *H01J 37/28* (2013.01); *G06T 2207/10016* (2013.01); *G06T 2207/10061* (2013.01); *G06T 2207/20081* (2013.01); *G06T 2207/20084* (2013.01); *G06T 2207/30148* (2013.01); *H01J 2237/202* (2013.01); *H01J 2237/221* (2013.01); *H01J 2237/2817* (2013.01)

(56) References Cited

U.S. PATENT DOCUMENTS

| | | |
|---|---|---|
| 2016/0013015 A1 | 1/2016 | Potocek et al. |
| 2017/0069087 A1 | 3/2017 | Naka |
| 2017/0213355 A1 | 7/2017 | Hujsak et al. |
| 2018/0075594 A1 | 3/2018 | Brauer |

FOREIGN PATENT DOCUMENTS

| | | |
|---|---|---|
| JP | 2011-34342 A | 2/2011 |
| JP | 2015-129987 A | 7/2015 |
| JP | 2017-50222 A | 3/2017 |

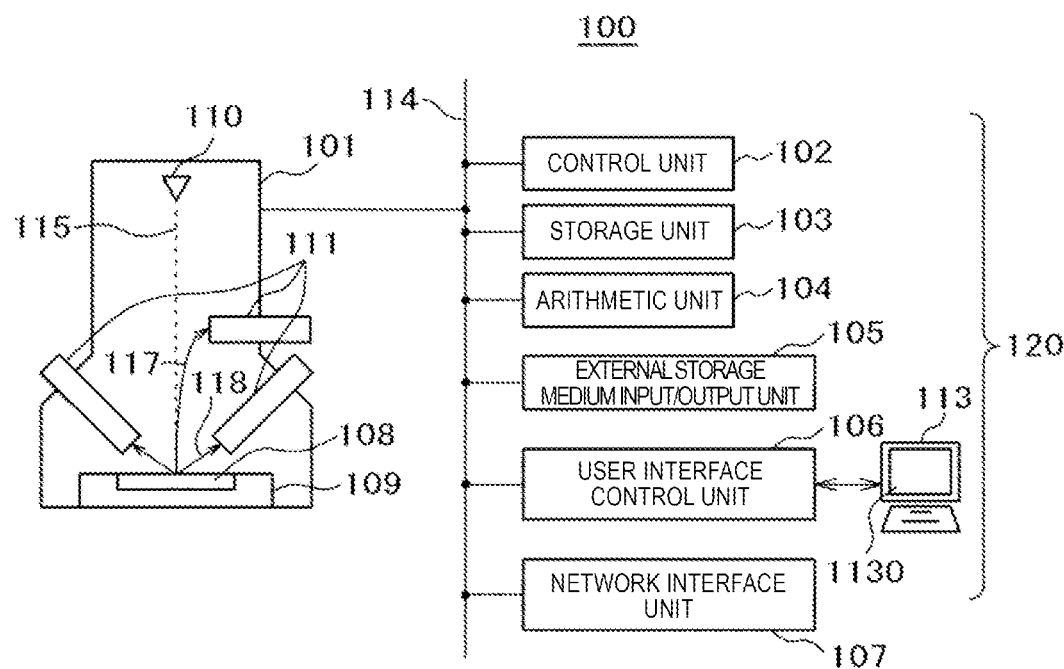
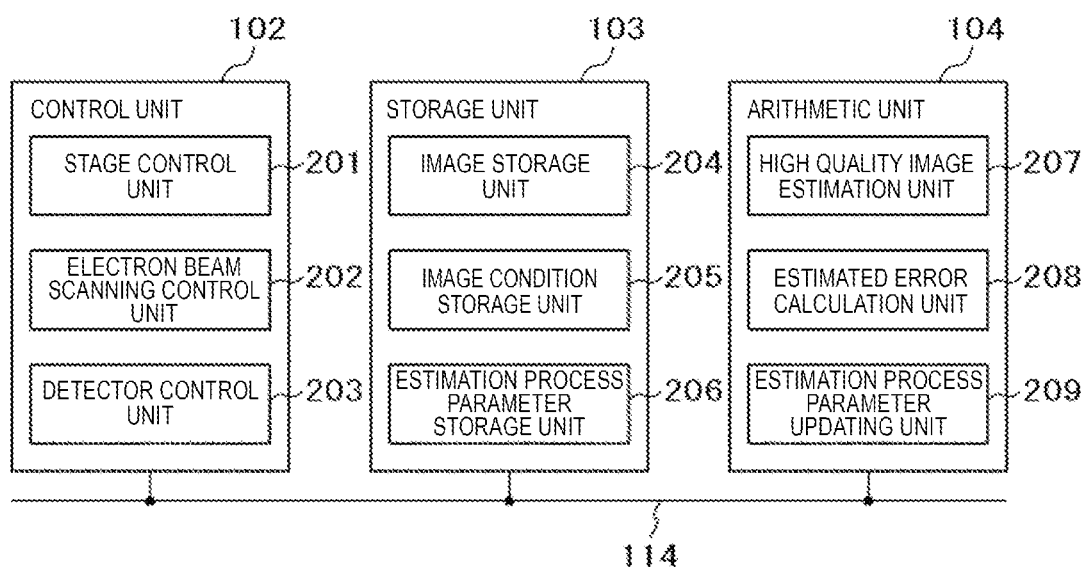

| IMAGING CONDITION | DEGRADED IMAGE | HIGH QUALITY IMAGE |
|---|---|---|
| IMAGE RESOLUTION | 200 × 200 | 500 × 500 |
| NUMBER OF ADDED FRAMES | 4 | 16 |
| PROBE CURRENT | 50pA | 100pA |
| FOCUS HEIGHT OFFSET | -0.1 ~ 1.0 | 0.0 ~ 0.0 |
| SCANNING WAITING TIME | 0 ~ 10 | 20 ~ 20 |

NUMBER OF LEARNING OBJECTIVE IMAGES TO BE ACQUIRED  400  ~961
ESTIMATED ERROR THRESHOLD VALUE ThErr  0.1  ~962
MAXIMUM REPETITION NUMBER  30,000  ~963

[LEARNING START] [PROGRESS CONFIRMATION] [CANCELLATION]
    940              970              950

SAMPLE OBSERVATION DEVICE AND SAMPLE OBSERVATION METHOD

BACKGROUND OF THE INVENTION

Field of the Invention

The present invention relates to a sample observation device and a sample observation method for observing a circuit pattern or a defect formed on a semiconductor wafer serving as a sample by using a charged particle microscope.

Background Art

When a semiconductor wafer is manufactured, in order to ensure profitability, it is important to quickly start a manufacturing process and to proceed to a high yield mass-production system at an early stage. For this purpose, various inspection devices, devices for observing a defect on a sample, or measuring devices are introduced to manufacturing lines.

The device for observing the defect on the sample outputs an image by imaging a defect position on a wafer in a high resolution manner, based on a defect position coordinate (coordinate information indicating the defect position on the sample (wafer)) output by the inspection device. As the device, a defect observation device (hereinafter, referred to as a review SEM) using a scanning electron microscope (SEM) is widely used.

Automated observation work is desired in semiconductor mass-production lines. The review SEM is provided with a function to perform automatic defect review (ADR) for automatically collecting images at a defect position inside the sample and a function to perform automatic defect classification (ADC) for automatically classifying the collected defect images.

The defect position coordinate output by the inspection device includes an error. Accordingly, the ADR is provided with a function to detect a defect again from the captured image by widening a visual field around the defect position coordinate output by the inspection device, and a function to obtain an observation objective image by imaging a re-detected defect position at a high magnification. As a method of detecting the defect from a SEM image, JP-A-2001-189358 (Patent Document 1) discloses a method of detecting the defect as follows. An image obtained by imaging a region having a circuit pattern which is same as a defect site is set as a reference image, and an image obtained by imaging the defect site is compared with the reference image.

In addition, JP-A-2007-40910 (Patent Document 2) discloses a method for detecting the defect from one image obtained by imaging the defect site.

In addition, JP-A-2015-129987 (Patent Document 3) discloses a method for generating a high-resolution image as follows. A learning objective image configured to include a pair of a low-resolution image and a high-resolution image is divided into small regions called patches, and a dictionary is prepared, based on a correspondence relationship therebetween. The low-resolution patch similar to the input low-resolution patch is extracted from the dictionary, and the high-resolution patch corresponding to the extracted low-resolution patch is extracted from the dictionary, thereby estimating the high-resolution patch corresponding to the input low-resolution patch.

In addition, JP-A-2011-34342 (Patent Document 4) discloses a method as follows. In the method, a projection relationship between low resolution information and high resolution information is learned, and the low resolution information is projected on the high resolution information in a restoration step. In addition, a method of using a convolution neural network is disclosed in "Image super-resolution using deep convolutional networks" written by Dong, Chao, et al., arXiv preprint arXiv: 1501.00092 (2014) (Non-Patent Document 1).

SUMMARY OF THE INVENTION

A device for observing a defect on a sample according to the present invention (hereinafter, referred to as a "sample observation device") relates to a device for imaging the sample such as a semiconductor wafer, acquiring an image, and observing the image.

In the sample observation device, it is important to capture and output a highly visible and high quality image of the defect or a circuit pattern. In addition, it is important to concurrently acquire more images per unit time (to be operated with higher throughput).

However, in general, there is a tradeoff between throughput and image quality. That is, in a charged particle microscope such as a SEM used for the sample observation device, in order to improve a signal to noise ratio (SNR) of the image, it is an effective way to increase an irradiation quantity (dose) of the charged particle. That is, in order to improve the SNR of the image, it is an effective way to increase the number of added frames by reducing scanning speed for irradiating and scanning a sample surface with charged particles.

However, an image acquisition time is accordingly lengthened, thereby leading to a decrease in the throughput in a case where many locations are sequentially observed. In addition, in a case where a focus height of a charged particle beam does not coincide with the sample surface, the image is blurred. Accordingly, the focus height needs to be automatically adjusted (autofocus). However, it takes time to perform this autofocus.

In addition, an imaging device such as the charged particle microscope has a narrow visual field. Accordingly, the sample such as the semiconductor wafer is loaded on an XY-stage, and the stage is controlled so that a desired imaging position is included in an imaging visual field. In order to improve the throughput, it is an effective way to move the stage at high speed. However, it takes time until the stage is completely stopped after the stage is controlled so as to stop the stage operated at high speed.

Therefore, until imaging starts after the moving stage is stopped by receiving a stop control signal, it is necessary to set a waiting time required before the stage is completely stopped. In a case where a scanning type of the charged particle microscope starts scanning with the charged particle beam before the stage is stopped, image shaking or distortion occurs inside a plane of the captured image. For example, an originally linear structure is imaged as if the structure is curved.

To summarize the above-described circumstances, if the number of added frames is reduced, the focus height is not automatically adjusted, and the waiting time is shortened from when the stage is controlled to be stopped until the scanning starts, it is possible to acquire the images with higher throughput. Hereinafter, this imaging condition will be referred to as a higher throughput imaging condition.

If it is possible to obtain a high quality image by removing a degradation factor from a degraded image caused by the higher throughput imaging condition, it is possible to compatibly achieve the higher throughput and the higher image quality. Therefore, visibility has been improved using image processing techniques, for an actually captured image in which a signal obtained from a detector of the imaging device is imaged (hereinafter, these techniques are referred to as learning type techniques). As one of the techniques, many methods have been proposed in which a correspondence relationship between a low quality image and a high quality image is learned in advance so as to estimate the high quality image when the low quality image is input. For example, the methods disclosed in Patent Documents 3 and 4 and Non-Patent Document 1 are respectively corresponding cases.

A learning type high quality image estimation process is utilized, thereby enabling the high quality image to be output even under the higher throughput imaging condition. However, in a case of the learning type techniques, it is necessary to acquire a pair of the low quality image and the high quality image which are used for learning.

In this case, the degraded image used for learning needs to correspond to the actually captured image (image to be input to an estimation process (restoration process) of a high magnification image). That is, in a case where the learning is performed using only an image pair of a low resolution image and a high resolution image, it is possible to estimate (restore) the high resolution image from the low resolution image. However, it is difficult to estimate a less blurred image from blurred images generated due to focus misalignment. However, Patent Documents 3 and 4 and Non-Patent Document 1 do not pay attention to a method of estimating the less blurred image from the blurred images generated due to the focus misalignment.

As a method of acquiring a learning objective image, Patent Document 3 or Non-Patent Document 1 discloses a method in which an image obtained by downsampling the high resolution image is used as the low resolution image.

However, in the charged particle microscope, a divergence occurs between the image obtained by downsampling the high resolution image and the image actually captured at the low resolution. The reason is as follows. In a case where the image is captured at the high resolution and in a case where the image is captured at the high resolution, irradiation quantities (doses) of charged particles per pixel are different from each other. Consequently, a charging state of the sample surface is changed.

In addition, in a case where the blurred image generated by the focus misalignment is prepared from the high quality image, a method of convolving a point spread function (PSF) is conceivable. However, in general, it is difficult to accurately obtain the point spread function.

As described above, the image including the degradation factor (degraded image) which can actually occur is less likely to be prepared from the high quality image. None of the above-described known examples discloses a method for solving this problem.

The present invention is made in order to solve the above-described problems in the related art, and aims to provide a sample observation device and a sample observation method which are capable of acquiring a high quality image with higher throughput by enabling the high quality image to be accurately estimated from degraded images including a degradation factor (degraded resolution, a degraded SNR, blurring, and image shaking) occurring under a higher throughput imaging condition.

In order to solve the above-described problems, for example, configurations described in appended claims are adopted.

The present invention includes a plurality of means for solving the above-described problems. According to an aspect of the present invention, there is provided a sample observation device configured to include a charged particle microscope that images a sample placed on a movable table by irradiating and scanning the sample with a charged particle beam, an image storage unit that stores a degraded image having poor image quality and a high quality image having satisfactory image quality which are acquired at the same location of the sample by causing the charged particle microscope to change an imaging condition for imaging the sample, an arithmetic unit that calculates an estimation process parameter for estimating the high quality image from the degraded image by using the degraded image and the high quality image which are stored in the image storage unit, a high quality image estimation unit that processes the degraded image obtained at a desired site of the sample which is obtained by causing the charged particle microscope to image the desired site of the sample, by using the estimation process parameter calculated by the arithmetic unit, and that estimates the high quality image obtained at the desired site, and an output unit that outputs the high quality image estimated by the high quality image estimation unit.

In addition, according to another aspect of the present invention, there is provided a sample observation device configured to include a charged particle microscope that images a sample placed on a movable table by irradiating and scanning the sample with a charged particle beam, an image storage unit that stores a low magnification image obtained by causing the charged particle microscope to image the sample at low magnification, and a high quality image obtained by causing the charged particle microscope to image a portion of a region of the sample which is imaged at low magnification, at high magnification, an arithmetic unit that enlarges and generates an image of a region corresponding to the high quality image in the low magnification image stored in the image storage unit, and that calculates an estimation process parameter for estimating an image corresponding to the high quality image from a degraded image which is an enlarged image, a high quality image estimation unit that processes a partial region of the low magnification image obtained at a desired site of the sample which is obtained by causing the charged particle microscope to image the desired site of the sample, by using the estimation process parameter calculated by the arithmetic unit, and that estimates the high quality image of the partial region, and an output unit that outputs the high quality image estimated by the high quality image estimation unit.

In addition, according to another aspect of the present invention, there is provided a sample observation method of observing a sample by using a charged particle microscope. The sample observation method includes causing the charged particle microscope to image the sample placed on a movable table, causing an image storage unit to store a degraded image having poor image quality and a high quality image having satisfactory image quality which are acquired at the same location of the sample by causing the charged particle microscope to change an imaging condition for imaging the sample, causing an arithmetic unit to calculate an estimation process parameter for estimating the high quality image from the degraded image by using the degraded image and the high quality image which are stored in the image storage unit, causing a high quality image estimation unit to process the degraded image obtained at a desired site of the sample which is obtained by causing the charged particle microscope to image the desired site of the sample, by using the estimation process parameter calculated by the arithmetic unit, and to estimate the high quality image obtained at the desired site, and causing an output unit to output the high quality image estimated by the high quality image estimation unit.

Furthermore, according to another aspect of the present invention, there is provided a sample observation method of observing a sample by using a charged particle microscope. The sample observation method includes causing an image storage unit to store a low magnification image obtained by causing the charged particle microscope to image the sample at low magnification, and a high quality image obtained by causing the charged particle microscope to image a portion of a region of the sample which is imaged at the low magnification, at high magnification, causing an arithmetic unit to enlarge and generate an image of a region corresponding to the high quality image in the low magnification image stored in the image storage unit, and to calculate an estimation process parameter for estimating an image corresponding to the high quality image from a degraded image which is an enlarged image, causing a high quality image estimation unit to process a partial region of the low magnification image obtained at a desired site of the sample which is obtained by causing the charged particle microscope to image the desired site of the sample, by using the estimation process parameter calculated by the arithmetic unit, and to estimate the high quality image of the partial region, and causing an output unit to output the high quality image estimated by the high quality image estimation unit.

According to the present invention, a high quality image can be accurately estimated from images including a degradation factor (degraded resolution, a degraded SNR, blurring, and image shaking) occurring under a higher throughput imaging condition. In this manner, the high quality image can be acquired with higher throughput.

In addition, differences in image quality generated between imaging devices having mutually different model numbers and device types can be combined with each other. This can be easily realized, for example, if learning and estimating are performed by considering an image acquired by any device as a high quality image and by considering an image captured by a different device as a degraded image. In this manner, it is possible to reduce a difference between the devices. For example, measurement errors can be reduced.

The problems, configurations, and advantageous effects other than those described above will be clarified from the description of the following embodiments.

BRIEF DESCRIPTION OF THE DRAWINGS

FIG. 1 is a block diagram illustrating a schematic configuration of a sample observation device according to Embodiment 1 of the present invention.

FIG. 2 is a block diagram illustrating each configuration of a control unit, a storage unit, and an arithmetic unit of the sample observation device according to Embodiment 1 of the present invention.

DETAILED DESCRIPTION OF THE INVENTION

Figure 3:
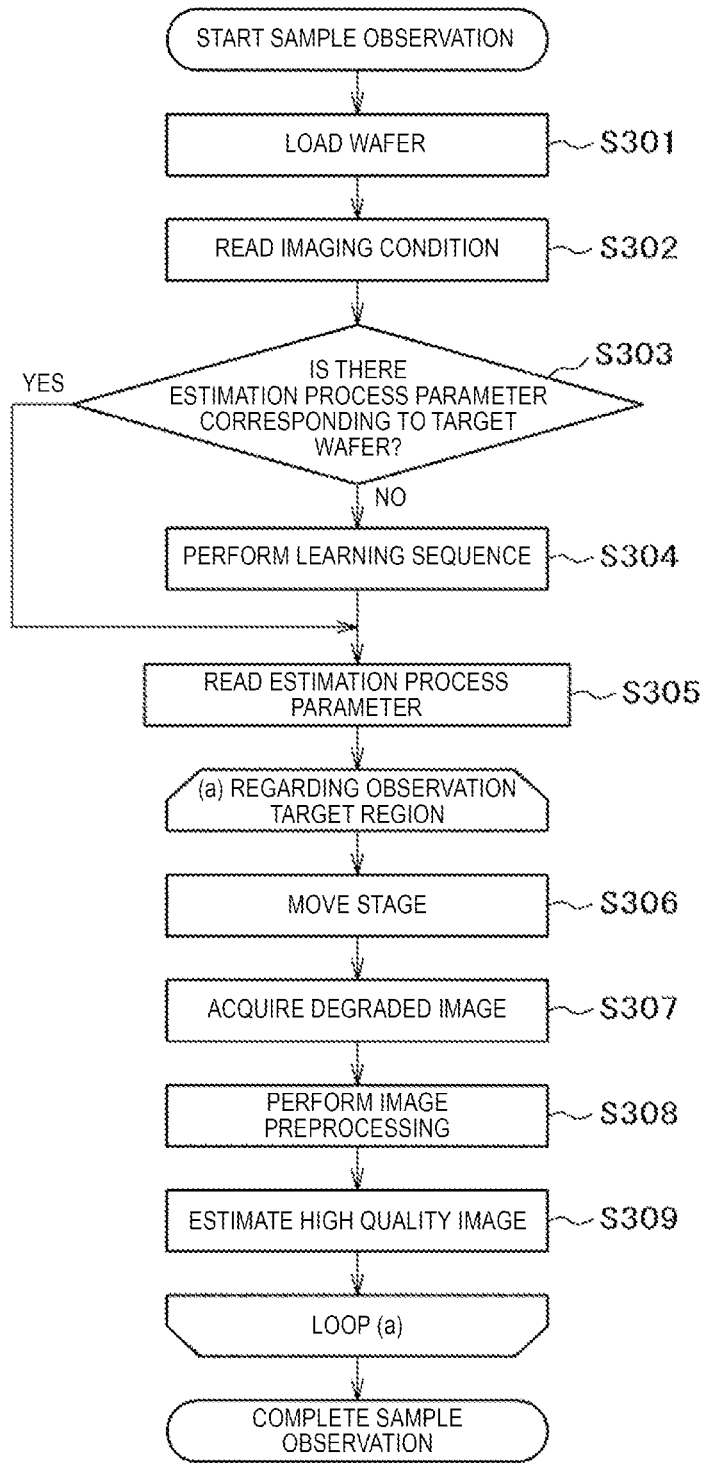
FIG. 3 is a flowchart illustrating a process flow of the sample observation device according to Embodiment 1 of the present invention.

A sample observation device according to the present invention is configured to estimate a less degraded high quality image from a degraded image having degraded image quality, and to observe the estimated high quality image.

Examples of the degraded image include an image having low resolution (fewer pixels), an image having a low a signal to noise ratio (SNR), a blurred image generated due to focus misalignment, a shaken image generated due to a shaken stage which holds a sample when imaged. In contrast, examples of the high quality image include an image having high resolution or SNR, and an image having sufficiently less blur or image shaking.

The device according to the present invention is provided with a method of obtaining a pair of images of the degraded image and the high quality image by changing an imaging condition for the same site on the sample, learning a correspondence relationship between both of the images by using a machine learning technique, and estimating the high quality image when the degraded image is input to the device.

That is, the degraded image corresponding to each degradation factor is acquired, and the degraded image is used for learning. In this manner, it is possible to estimate a less degraded high quality image from the image degraded due to various factors, and it is possible to observe the high quality image of the sample without performing imaging for acquiring the high quality image.

According to the present invention, a sample observation method includes a learning objective image acquisition step of acquiring a learning objective image group including a plurality of image pairs having mutually different image quality, an estimation process parameter learning step of setting the image pairs included in the learning objective image group, and learning and storing an estimation process parameter for estimating the high quality image from degraded image, and a high quality image estimation step of estimating and outputting an image corresponding to the high quality image from the degraded image.

Then, the sample observation method includes the following step. In the step of acquiring the pair of images in the learning objective image acquisition step, an image captured by changing one or more imaging conditions from preset imaging conditions so as to obtain desired image quality is set as the degraded image. An image captured under the preset imaging conditions so as to include an imaging visual field of the degraded image is set as the high quality image. In the step, image processing is applied to the degraded image and the high quality image which are captured.

Hereinafter, embodiments according to the present invention will be described with reference to the drawings.

Embodiment 1

A sample observation device according to the present embodiment will be described with reference to the drawings. In the present embodiment, the sample observation device including a scanning electron microscope (SEM) will be described as an imaging device for imaging a sample. However, the imaging device according to the present embodiment may be an imaging device other than the SEM, and may be an optical microscope or an imaging device using a charged particle such as ion. In addition, as an observation target image, an image obtained by imaging a defect on a semiconductor wafer will be described as a target. However, an image obtained by imaging other samples such as a flat panel display and a biological sample may also be used.

FIG. 1 illustrates a configuration of a sample observation device 100 including an imaging device 101 (hereinafter, referred to as a SEM 101) using the SEM according to the present embodiment. The sample observation device 100 is configured to include the SEM 101 which images the sample and a control system unit 120.

The control system unit 120 includes a control unit 102 which performs overall control, a storage unit 103 which stores information in a magnetic disk or a semiconductor memory, an arithmetic unit 104 which performs an arithmetic operation in accordance with a program, an external storage medium input/output unit 105 which inputs/outputs information with an external storage medium connected to the device, a user interface control unit 106 which controls an input/output of information with a user, and a network interface unit 107 which communicates with a defect image classification device (not illustrated) via a network 114.

In addition, an input/output terminal 113 configured to include a keyboard, a mouse, and a display 1130 is connected to the user interface control unit 106.

The SEM 101 is configured to include a stage 109 on which a sample wafer 108 serving as an observation target is loaded, and which is movable within an X-Y plane or an X-Y-Z space, an electron source 110 which generates an electron beam 115 used for irradiating the sample wafer 108, and a detector 111 which detects a secondary electron 117 or a backscattered electron 118 generated from the sample wafer 108 irradiated with the electron beam 115. In addition, the SEM 101 includes an electron lens (not illustrated) for converging the electron beam 115 onto the sample wafer 108, and a deflector (not illustrated) for scanning the sample wafer 108 with the electron beam 115.

FIG. 2 illustrates each configuration of the control unit 102, the storage unit 103, and the arithmetic unit 104 of the control system unit 120 according to the present embodiment.

The control unit 102 includes a stage control unit 201, an electron beam scanning control unit 202, and a detector control unit 203.

The stage control unit 201 controls the stage 109 to move or stop. The electron beam scanning control unit 202 controls a deflector (not illustrated) so that the sample wafer 108 is irradiated with the electron beam 115 within a predetermined visual field, and controls a scanning region of the electron beam 115 on the sample wafer 108. The detector control unit 203 samples a signal output from the detector 111 in synchronization with the scanning of the electron beam 115 driven by a deflector (not illustrated), and adjusts an offset, thereby generating a digital image.

The storage unit 103 includes an image storage unit 204 which stores the generated digital image together with supplementary information, an imaging condition storage unit 205 which stores an imaging condition, and an estimation process parameter storage unit 206 which stores parameters relating to an estimation process of the high quality image.

In addition, the arithmetic unit 104 includes a high quality image estimation unit 207 which estimates a high quality image from a degraded image, based on a process parameter, an estimated error calculation unit 208 which calculates an error between the high quality image obtained by capturing an image in a state where the imaging condition is set as a condition for acquiring the high quality image by the SEM 101 and the high quality image estimated from the degraded image including a degradation factor occurring under a higher throughput imaging condition corresponding to this image, and the estimation process parameter updating unit 209 which updates the estimation process parameter, based on the estimated error calculated by the estimated error calculation unit 208.

A sample observation method will be described with reference to FIG. 3.

First, the semiconductor wafer (sample wafer) 108 serving as the observation target is loaded on the stage (S301), and the imaging condition corresponding to the sample wafer 108 serving as the observation target is read from the imaging condition storage unit 205 (S302).

A semiconductor pattern formed on the sample wafer 108 is manufactured through a number of manufacturing processes. In some cases, an external shape of the semiconductor pattern may greatly vary in each process. Furthermore, in some cases, characteristics of the sample such as charging convenience may vary. Therefore, in general, the imaging condition is adjusted and stored for each process or each device. For the same reason, estimation accuracy is improved by managing the estimation process parameter of the high quality image for each process.

After the imaging condition is read, it is determined whether the estimation process parameter corresponding to the process performed on the sample wafer 108 is stored (S303). In a case where the estimation process parameter is not stored (in a case of "NO" in S303), the estimation process parameter is learned and stored through a learning sequence (to be described later) (S304). Next, the estimation process parameter of a high magnification image is read from the estimation process parameter storage unit 206 (S305).

Next, an observation target region on the sample wafer 108 is sequentially imaged using the SEM 101 under the higher throughput imaging condition, and a series of observations are performed. First, the control unit 102 controls and adjusts the stage 109 so that the observation target region on the sample wafer 108 is included in an imaging visual field of the SEM 101 (S306). Next, the SEM 101 irradiates and scans the sample wafer 108 with the electron beam 115. The detector control unit 203 processes a detection signal output from the detector 111 which detects the secondary electron 117 or the backscattered electron 118 generated from the observation target region irradiated with the electron beam 115, thereby acquiring an image (digital image) of the observation target region (S307). The image obtained here is an image (degraded image) whose image quality is degraded due to various degradation factors under the higher throughput imaging condition.

Next, the detector control unit 203 performs image preprocessing (S308) such as noise removal on the degraded image captured in S307. Next, based on the estimation process parameter read from the estimation process parameter storage unit 206 of the storage unit 103 in S305, with respect to the degraded image subjected to image preprocessing, the high quality image estimation unit 207 of the arithmetic unit 104 performs a process of estimating the high quality image (S309).

The above-described imaging process from S306 to S308 and the high quality image estimation process in S309 are repeatedly performed on a plurality of the observation target regions of the sample wafer 108. For example, the observation target region may be a region including a defect site detected in advance by an optical defect inspection device (not illustrated) or may be a region designated by a user.

In addition, the learning sequence (S304) may be appropriately performed by a user's instruction through a graphic user interface (GUI) displayed on a display 1130 of an input/output terminal 113 of the user interface control unit 106.

Figure 4:
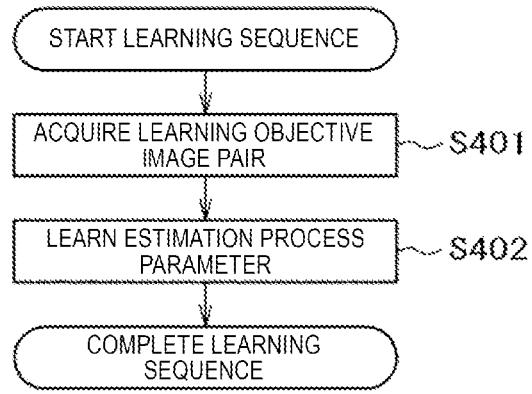
FIG. 4 is a flowchart illustrating a process flow of a process learning sequence of the sample observation device according to Embodiment 1 of the present invention.

As illustrated in FIG. 4, the learning sequence in S304 indicates a series of flows in acquiring a learning objective image pair (S401) and learning the estimation process parameter (S402).

The acquisition of the learning objective image pair in S401 is a process of acquiring a plurality of pairs of the degraded image and the high quality image which are captured at the same site on the sample wafer 1. This process flow will be described with reference to FIG. 5.

First, a region for acquiring a learning objective image from the sample wafer 1 is set (S501). In this case, any given observation target region may be sampled and extracted from the sample wafer 1, or may be randomly set within a sample surface. After the stage 109 is controlled (S502) so that the region for acquiring the learning objective image is included in the imaging visual field of the SEM 101, the SEM 101 images the region for acquiring the learning objective image, the degraded image is acquired (S503), and the high quality image is acquired (S504), as will be described later. In acquiring the images, any order may be used. After the image is acquired, supplementary information is added so that the images are paired, and is stored in the image storage unit 204.

Details of the process of acquiring the degraded image (S503) will be described with reference to FIG. 6.

Here, this configuration aims to acquire the image degraded under the higher throughput imaging condition. Therefore, as the imaging condition, the number of added frames is set (S601), an image resolution is set (S602), an electron beam focus height is set (S603), a scanning waiting time after controlling the stage to stop is set (S604). After the imaging condition is set to be equal to the higher throughput imaging condition, the sample wafer 1 is imaged by the SEM 101 (S605).

The number of added frames set in S601 is an imaging condition relating to an image SNR. If the number of added frames is increased, the SNR is improved, thereby improving image quality of the obtained image. However, the imaging time is lengthened. Therefore, under the higher throughput imaging condition, a value smaller than the imaging condition for acquiring the high quality image is set as the number of added frames. As a result, the image acquired under the higher throughput imaging condition is an image having a lower SNR which includes more noise components compared to the high quality image.

In addition, the image resolution set in S602 means an image size for the visual field. For example, in a case where the high quality image is captured using 500×500 pixels, the same visual field is imaged under the higher throughput imaging condition, using a smaller number of pixels, for example, 200×200 pixels. This corresponds to an increase in the pixel size per pixel of the image obtained by imaging the visual field under the higher throughput imaging condition, compared to the high quality image. In this manner, the image acquisition time can be shortened.

In addition, in order to improve the imaging throughput, it is an effective way to reduce the time needed to perform automatic adjustment (autofocus) of a focus height so as to align a focus position of the electron beam 115 of the SEM 101 with the surface of the sample wafer 1. However, if the automatic adjustment is performed, the automatic adjustment causes focus misalignment.

Therefore, when the electron beam focus height is set (S603), in order to acquire a blurred image as the degraded image by setting the focus position of the electron beam 115 to a position deviated from the surface of the sample wafer 108, an offset is randomly added to a preset range of the focus height of the electron beam 115 which is obtained by performing the automatic adjustment.

In addition, the imaging time of the SEM 101 can be shortened by setting a shorter waiting time required from when the stage control unit 201 issues a control command to stop the stage 109 until the scanning of the electron beam 115 starts based on a control signal from the electron beam scanning control unit 202. However, if the scanning of the electron beam 115 starts in a state where the stage 109 is not completely stopped, image shaking or distortion occurs in a plane of the image generated by the detector control unit.

In a scanning waiting time setting process (S604) for acquiring the degraded image, the scanning waiting time is set to be shorter than the time required until the stage 109 is completely stopped, such as until when the high quality image is acquired. In this manner, the degraded image in which image shaking or distortion occurs is acquired. The imaging condition for acquiring the degraded image can be set by a user through a GUI.

Figure 6:
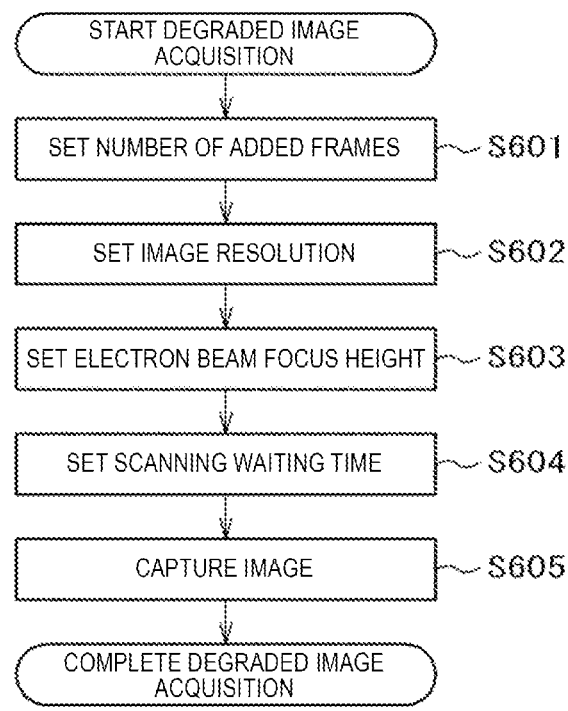
FIG. 6 is a flowchart illustrating a process of acquiring a degraded image in the process of acquiring the pair of learning objective images in the process learning sequence of the sample observation device according to Embodiment 1 of the present invention.

The process flow of acquiring the high quality image (S504) is also the same as the process flow of acquiring the degraded image described in FIG. 6. However, in order to acquire the high quality image, the imaging condition is set so that a sufficiently less degraded image can be obtained.

Specifically, in a step corresponding to setting of the number of added frames (S601) in FIG. 6, the number of added frames is increased to such an extent that the noise is not noticeable compared to a case where the degraded image is acquired. In addition, in a step corresponding to setting of the image resolution (S602), the resolution of the image is set to have a great value large to such an extent that a circuit pattern or a defect structure can be observed.

In addition, in a step corresponding to setting of the electron beam focus height (S603) in FIG. 6, the focus height of the electron beam 115 with respect to the surface of the sample wafer 108 is automatically adjusted by performing an autofocus process for each image acquisition.

In addition, in a step corresponding to setting of the scanning waiting time (S604) in FIG. 6, the waiting time from when the stage control unit 201 issues the control command to stop the stage 109 until the scanning on the surface of the sample wafer 108 starts using the electron beam 112 may be set to the time required until the stage is completely stopped (the waiting time may be further provided from when the degraded image is completely captured).

Compared to a case where the degraded image is acquired, it takes more time to capture the high quality image under these conditions. However, in a step of processing the sample wafer 108 serving as the observation target, it is not necessary to repeat the learning sequence for each sample wafer 108. The learning sequence may be performed at least once on the first sample wafer 108. Therefore, in a case where the sample wafer 108 processed in the same step is loaded, it is not necessary to perform the learning sequence, and it is not necessary to acquire the high quality image. A user can also set the imaging condition for the high quality image through the GUI.

Referring back to the flow in FIG. 4, after a plurality of image pairs of the degraded image and the high quality image for learning are acquired in S401, the estimation process parameter is learned (S402).

A detailed process flow of the estimation process parameter learning in S402 will be described with reference to FIG. 7. First, image preprocessing such as noise removal is performed on all of the degraded images and the high quality image which are captured in S401 (S701).

Next, alignment between the degraded image and the high quality image is performed (S702). The degraded image is acquired by starting the scanning of the electron beam 115 with the SEM 101 before the stage 109 is stopped after moving. Accordingly, in some case, the scanning position may be deviated from the imaging position of the high quality image. Therefore, it is necessary to perform the alignment between the degraded image and the high quality image. However, due to degradation such as image shaking, distortion, and blur, it is difficult to perfectly align the imaging position.

Here, it is not necessary to strictly perform the alignment, and normalization correlation or a mean square error may be used as an evaluation value, and the alignment may be performed, based on a position where the evaluation value is maximum or minimum. In a case where the image resolution (the number of pixels per image in the same visual field, that is, an image size) varies, prior to the alignment, the degraded image is enlarged by means of linear interpolation so that the image resolution (pixel size) matches the high quality image.

Next, the estimation process parameter is initialized (S703). In this case, the estimation process parameter learned in advance may be read from the estimation process parameter storage unit 206 so as to be used as an initial value.

Next, the high quality image is estimated from the degraded image, based on the estimation process parameter (S704), the estimated error is calculated for the captured high quality image (S705), and the estimation process parameter is updated so that the estimated error decreases (S706).

The above-described learning is performed by repeating the processes in S704 to S706 as many as the preset designated number of times. However, the obtained estimated error may be appropriately compared with a preset threshold value (S707). In a case where the obtained estimated error is smaller than the threshold value, the repeated process may be intermediately terminated. The finally obtained estimation process parameter is stored in the estimation process parameter storage unit 206 together with supplementary information such as a process name (S708).

Figures 8, 9:
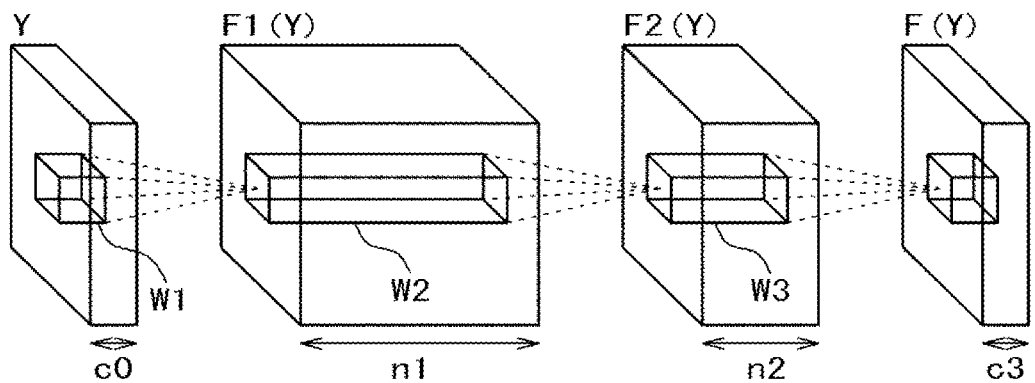
FIG. 8 is a block diagram illustrating a configuration of a convolution neural network for estimating a high quality image in the sample observation device according to Embodiment 1 of the present invention.
FIG. 9 is a GUI for setting an imaging condition in the sample observation device according to Embodiment 1 of the present invention.

As a method of estimating the high quality image from the degraded image in S704, the convolution neural network described in Non-Patent Document 1 may be used. Specifically, a neural network having a three-layer structure as illustrated in FIG. 8 may be used. Here, Y represents an input image, F1 (Y) and F2 (Y) represent intermediate data, and F (Y) represents an estimation result of the high quality image.

The intermediate data and the final result are calculated by the following equations such as (Equation 1) to (Equation 3). In Equations (1) to (3), "*" represents a convolution operation. Here, W1 represents the n1-number of filters having a size of $c0 \times f1 \times f1$, c0 represents the number of channels of the input image, and f1 represents a size of a spatial filter. An n1-dimensional feature map is obtained by convolving the filter having the size of $c0 \times f1 \times f1$ for the input image as many as n1 times.

B1 represents an n1-dimensional vector, and is a bias component corresponding to the n1-number of filters. Similarly, W2 represents a filter having a size of $n1 \times f2 \times f2$, B2 represents an n2-dimensional vector, W3 represents a filter having a size of n2×f3×f3, and B3 represents a c3-dimensional vector.

$$F1(Y)=\max(0, W1*Y+B1) \quad \text{(Equation 1)}$$

$$F2(Y)=\max(0, W2*F1(Y)+B2) \quad \text{(Equation 2)}$$

$$F(Y)=W3*F2(Y)+B3 \quad \text{(Equation 3)}$$

Among these, c0 and c3 are values determined by the number of channels of the degraded image and the high quality image. In addition, f1 and f2, and n1 and n2 are hyper parameters determined by a user before the learning sequence is performed. For example, the parameters may be determined as f1=9, f2=5, n1=128, and n2=64. The parameters to be adjusted by performing the learning process of the estimation process parameter (S402) are W1, W2, W3, B1, B2, and B3.

As a configuration of the convolution neural network described above, other configurations may be used. For example, the number of layers may be changed or a network having four or more layers may be used. In addition, a method other than the convolution neural network may be used. For example, as disclosed in Patent Document 3, the learning objective image configured to include a pair of the degraded image and the high quality image may be divided into small regions called patches. A correspondence relationship is used so as to estimate the patch of the high quality image with respect to the patch of the input degraded image. In this manner, the high quality image may be generated.

In an estimation process parameter updating process (S706), a general error back propagation method may be used in learning the neural network. When the estimated error is calculated, all of the acquired learning objective image pairs may be used, but a mini batch method may be used. That is, the parameter may be repeatedly updated by randomly extracting several images from the learning objective image pairs. Furthermore, a patch image may be randomly cut out from one image pair, and may be used as the input image Y of the neural network. In this manner, the learning can be efficiently performed.

In an estimated error calculation process (S705), a difference (error) is evaluated between the estimation result F(Y) and the high quality image. The parameter is updated so that the estimated error obtained in this process decreases. As a method for quantifying the difference (error) between images, a mean square error may be used.

Next, a GUI according to the present embodiment will be described. First, in a learning objective image pair acquisition step S401, a GUI 900 for setting the imaging condition of the degraded image and the high quality image is provided (FIG. 9). After the imaging condition of a "degraded image" 902 and the imaging condition of a "high quality image" 930 are set for each item set in a column of an "imaging condition" 910 column through this GUI 900, a user presses a "learning start" button 940. In this manner, the learning sequence in S304 can be performed.

The items to be set in the column of the "imaging condition" 910 include the image resolution set in S602, the number of added frames set in S601, a probe current of the electron beam 115 used by the SEM 101 irradiating the sample wafer 108, an offset amount of the focus height of the electron beam 112 set in S603, and the scanning waiting time set in S604.

In addition, if the user presses a "cancellation" button 950 while the learning sequence is performed, the user can interrupt the learning sequence. Furthermore, the GUI 900 displays an input unit 961 for setting the number of learning objective images to be acquired, an input unit 962 for setting an estimated error threshold value ThErr, and an input unit 963 for setting the maximum repetition number.

Figure 10:
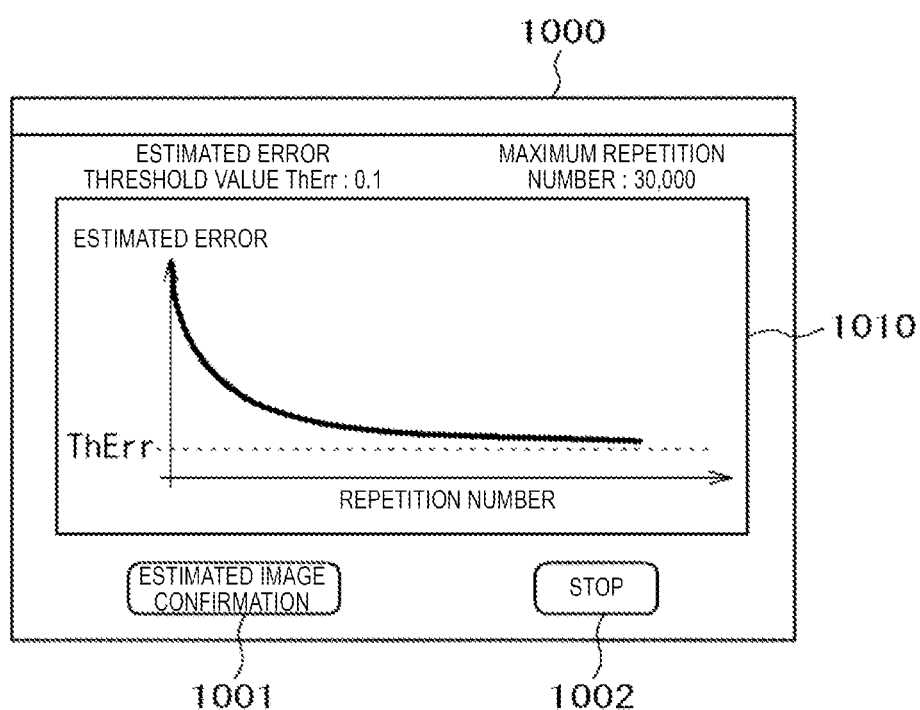
FIG. 10 is a GUI for confirming an estimated error for each learning step in the sample observation device according to Embodiment 1 of the present invention.

In addition, if the user presses a "progress confirmation" button 970, the display is switched to a screen (GUI) 1000 for confirming progress of the estimation process parameter updating process as illustrated in FIG. 10. This screen includes an interface in which the parameter updating repetition number and the progress of the estimated error are displayed on a graph 1010. If the user presses a "stop" button 1002 on the screen in FIG. 10, the repeated parameter updating is stopped.

Figure 11A:
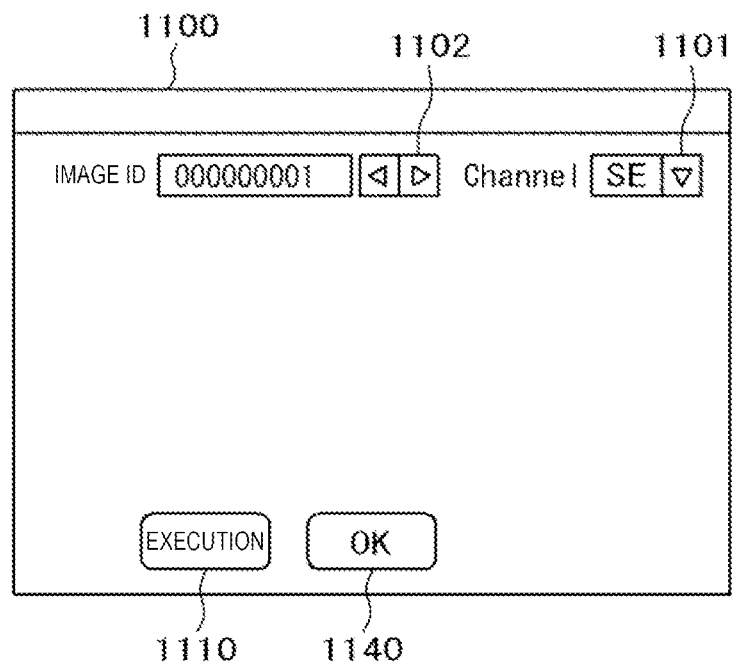
FIG. 11A is a GUI for designating an image to be displayed from the high quality image estimated in the degraded image in the sample observation device according to Embodiment 1 of the present invention.

In addition, if the user presses an "estimated image confirmation" button 1001, the display is switched to a screen (GUI) 1100 as illustrated in FIG. 11A. On the screen 1100, a channel selection unit 1101 designates a type of image such as a secondary electron image (SE) and a backscattered electron image (BSE). If the user presses an image ID selection button 1102, designates the number of the image, and presses an "execution" button 1110, an estimation process is performed on the image ID designated using the updated estimation parameter.

Figure 11B:
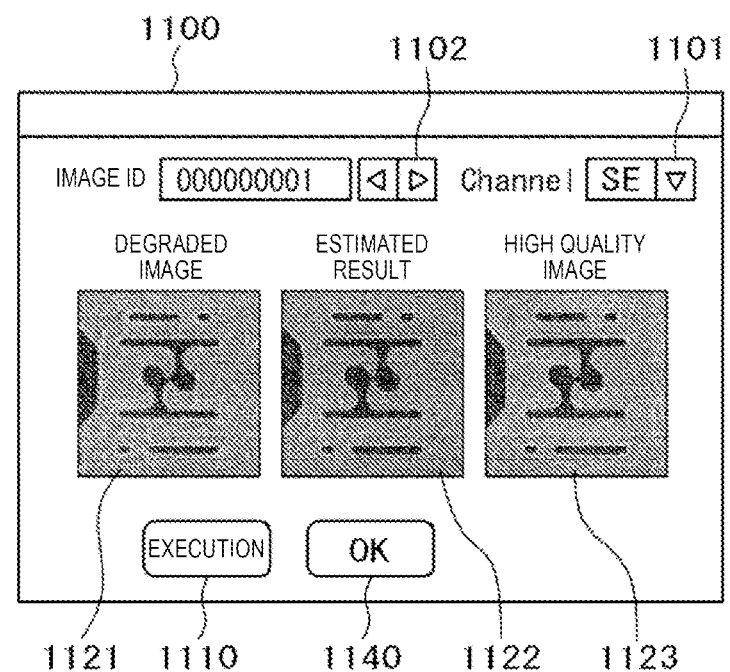
FIG. 11B is a GUI for displaying the designated image from the high quality image estimated in the high quality image estimated from the degraded image in the sample observation device according to Embodiment 1 of the present invention.

If this estimation process is completed, on a screen (GUI) 1150 as illustrated in FIG. 11B, a degraded image 1121 corresponding to the designated image ID and an estimation result 1122 obtained from the degraded image 1121 through the estimation process, and a high quality image 1123 are displayed.

If the user confirms the estimation result 1122 on the screen 1150 and presses an "OK" button 1140, the display is switched to an original screen 900 as illustrated in FIG. 9. If the result of confirming the estimation result 1122 on the screen 1150 is satisfactory, a parameter updating operation in the learning process is completed. On the other hand, in a case where the result of confirming the estimation result 1122 on the screen 1150 is not satisfactory, the user adjusts the imaging condition parameter on the screen 900, and performs the learning again.

As described above, in the present embodiment, in the process of observing the sample, as the learning sequence, the following steps are performed. The steps include a learning objective image acquisition step (S401) of acquiring a learning objective image group including a plurality of image pairs having different image qualities at the same site on the sample wafer 108, an estimation process parameter learning step (S402) of setting the image pair included in the acquired learning objective image group as a target, and learning and storing the estimation process parameter for estimating the high quality image from the degraded image, and a high quality image estimation step (S309) of estimating and outputting an image corresponding to the high quality image from the degraded image by using the learned estimated parameter.

In this manner, even in a case where the SEM 101 images the sample wafer 108 for a relatively long time and does not acquire the high quality image, it is possible to estimate the high quality image from the degraded image captured in a high throughput mode and acquired within a relatively short time.

In addition, in order to acquire a pair of images in the learning objective image acquisition step (S401), an image captured by changing one or more imaging conditions from the imaging conditions of the high quality image which are preset so as to obtain desired image quality is set as the degraded image. In this manner, the high quality image may be captured so as to include the imaging visual field of the degraded image.

According to the present embodiment, the defect observation device is provided with the above-described processing functions. In this manner, it is possible to estimate the high quality image from the degraded image captured under the higher throughput imaging condition. Thus, it is not necessary to acquire the high quality image for a relatively long time by causing the SEM 101 to image the sample wafer 108 under the condition for acquiring the high quality image. Therefore, it is possible to compatibly achieve the higher throughput and the higher image quality.

The high quality image estimated through the above-described technique may be used so as to perform defect detection, or observation, classification, and circuit pattern measurement of detected defects.

Embodiment 2

In Embodiment 1, a method has been described in which the higher throughput and the higher image quality are compatibly achieved by estimating the high quality image in the same visual field (the same imaging region) from the degraded image captured under the higher throughput imaging condition. In Embodiment 2, in automatic defect observation, a method will be described in which an image (high magnification image) obtained when captured at high magnification is estimated from an image (low magnification image) captured at low magnification, for a portion of a region included in the low magnification image. In this manner, the step of capturing the image at high magnification can be eliminated, and the throughput can be improved.

A configuration of the defect observation device provided with an automatic defect observation function according to the present embodiment is basically the same as the configuration illustrated in FIGS. 1 and 2 described in Embodiment 1. In addition, a process flow of the automatic defect observation of the defect observation device according to the present embodiment includes the process flow which is equal to the process flow illustrated in FIGS. 3 to 7 described in Embodiment 1. In addition, a GUI of the defect observation device according to the present embodiment includes an interface which is equal to that illustrated in FIGS. 9 to 11B described in Embodiment 1.

In the present embodiment, the high quality image estimation process described in Embodiment 1 is introduced to an automatic defect observation process. In this manner, the present embodiment intends to realize improved throughput in a case of sequentially observing a plurality of defects.

Figure 12:
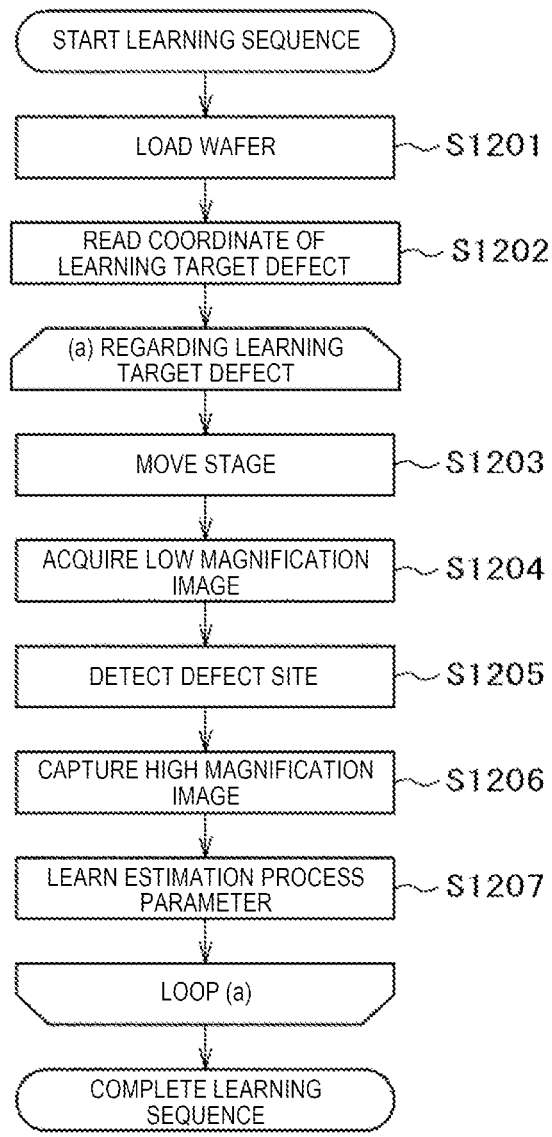
FIG. 12 is a flowchart illustrating a process flow of a learning sequence in a flow of an automatic defect observation process in the sample observation device according to Embodiment 2 of the present invention.

With regard to the automatic defect observation process in the defect observation device according to the present embodiment, FIG. 12 illustrates a process flow corresponding to performing the learning sequence in S301 to S304, in the process flow illustrated in FIG. 3 described in Embodiment 1.

First, the sample wafer 108 serving as the observation target sample is loaded on the stage 109 of the SEM 101 (S1201: corresponding to S301 in FIG. 3), and coordinate information of the learning target defect is read (S1202: corresponding to S302 in FIG. 3). Here, the coordinate information of the learning target defect means coordinate information of a position of the defect which is inspected and output in advance by another visual inspection device (not illustrated), and means information stored in the storage unit 103 via the network 114.

Figure 5:
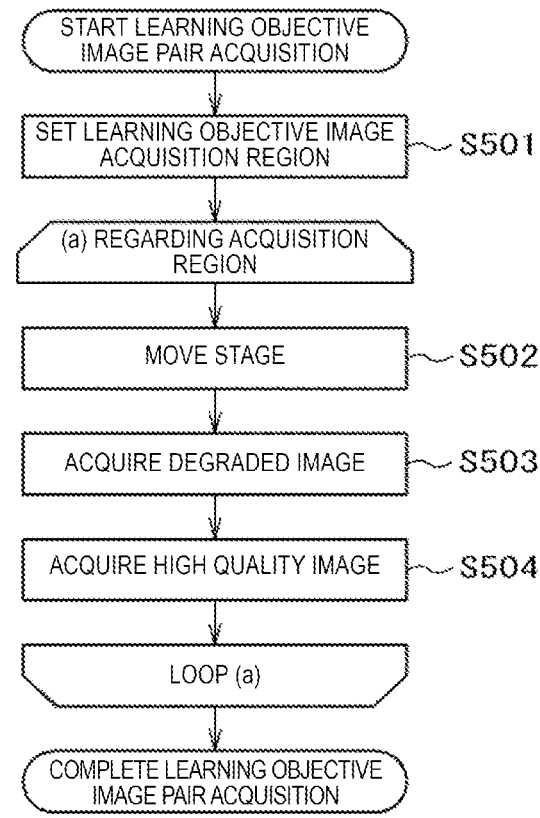
FIG. 5 is a flowchart illustrating a process of acquiring a pair of learning objective images in the process learning sequence of the sample observation device according to Embodiment 1 of the present invention.

Next, the stage 109 is controlled and moved by the stage control unit 201 so that the coordinate of the position of the learning target defect read in order to image the learning target defect in S1202 is included in the imaging visual field of the SEM 101 (S1203: corresponding to S502 in FIG. 5).

However, the defect coordinate output by the visual inspection device includes an error of approximately several micrometers (µm). Accordingly, if the image is captured by the SEM 101 at high magnification in which the visual field on the sample wafer 108 is approximately 1 µm, the learning target defect may not be included in the captured visual field, in some cases. Therefore, the following processes are performed step by step. The low magnification image in a relatively wide visual field, in which the visual field of the SEM 101 is widened to approximately 10 µm is captured (S1204: corresponding to S503 in FIG. 5). A defect site (defect) is detected from the captured image (S1205). The detected defect site is imaged at high magnification by narrowing the visual field (S1206: corresponding to S504 in FIG. 5). As the method of detecting the defect site (defect) in S1205, the method disclosed in Patent Document 1 or Patent Document 2 may be used. The process in each step from S1204 to S1206 is performed under the control of the detector control unit 203.

Next, a region including the defect site detected using the low magnification image is enlarged so as to generate an enlarged image, thereby performing estimation parameter learning in which the estimation process parameter for estimating the high magnification image from the enlarged image is calculated (S1207). In the enlarged image generated by partially enlarging the low magnification image, noise components included in the low magnification image are amplified, and becomes an image whose image quality is degraded as compared to the low magnification image.

In this estimation parameter learning, within the low magnification image captured in S1204, the enlarged image generated by enlarging an image in a region imaged at high magnification in S1206, that is, an image in the same region as the region including the defect site detected in S1205 is regarded as the degraded image in Embodiment 1.

In addition, an image obtained by imaging the region including the defect site acquired at high magnification in S1206 is regarded as the high quality image in Embodiment 1. The degraded images and the high quality image are used, thereby performing the process the same as the process described with reference to FIG. 7.

Figure 7:
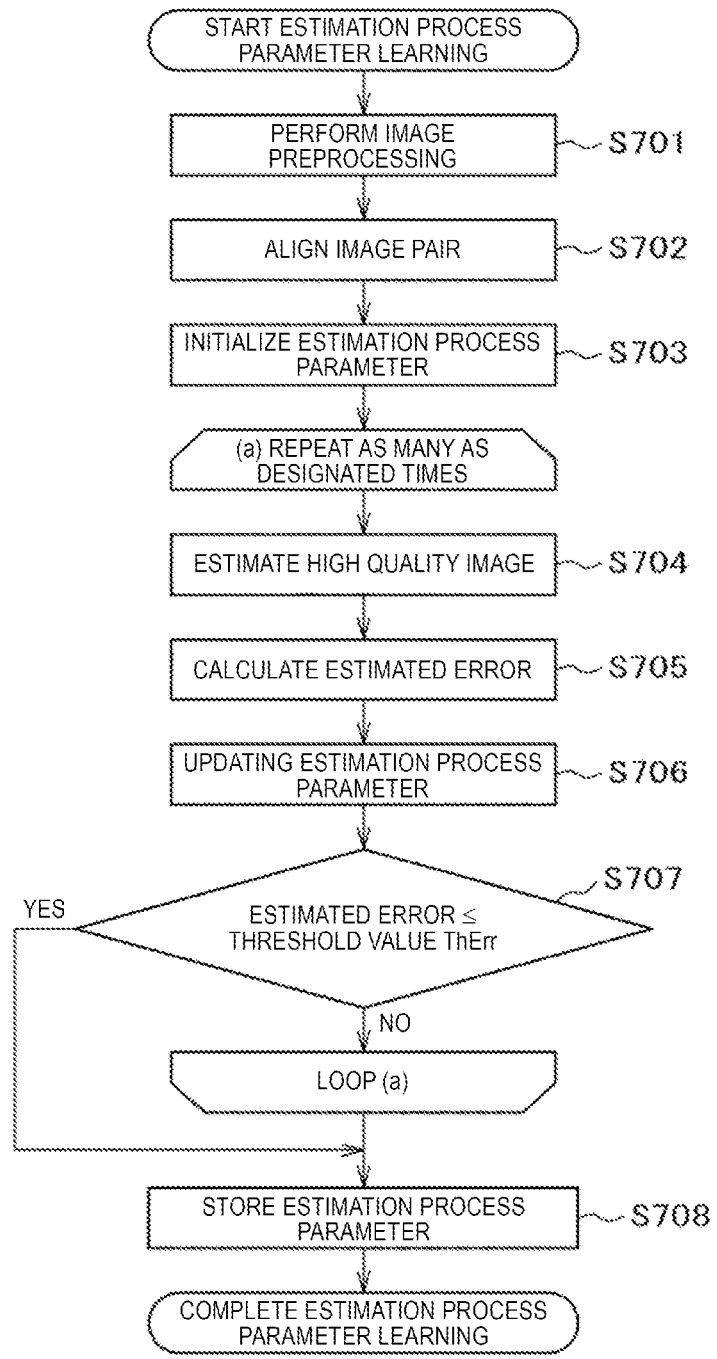
FIG. 7 is a flowchart of a process of learning an estimation process parameter in the process learning sequence of the sample observation device according to Embodiment 1 of the present invention.

That is, in the procedure the same as the learning of the estimation process parameter from S701 to S708 described in FIG. 7, the estimation process parameter for estimating the high quality image which is the high magnification image is calculated from the enlarged image (degraded image) generated by enlarging the low magnification image of the region including the defect site detected in S1205.

Figure 13:
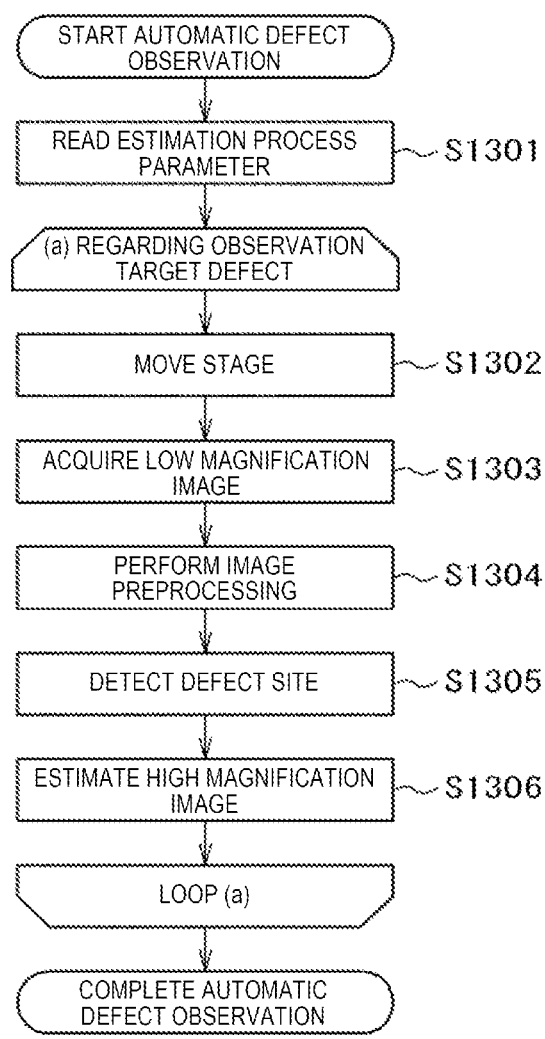
FIG. 13 is a flowchart illustrating a flow of the automatic defect observation process in the flow of an automatic defect observation process in the sample observation device according to Embodiment 2 of the present invention.

Next, in the automatic defect observation process using the defect observation device according to the present embodiment, FIG. 13 illustrates a process flow corresponding to the sequence S305 to S309 for sequentially observing the observation target region by reading the learned estimation process parameter, in the process flow illustrated in FIG. 3 described in Embodiment 1.

First, the estimation process parameter for estimating the high magnification image (high quality image) acquired by the SEM 101 from the enlarged image (degraded image) generated by partially enlarging the low magnification image acquired by the SEM 101, which is calculated in the flow described in FIG. 12 is read from the estimation process parameter storage unit 206 (S1301).

Next, the control unit 102 controls the stage to move so that the observation target defect on the sample wafer 108 is included in the imaging visual field of the SEM 101 (S1302). Next, the SEM 101 irradiates and scans a relatively wide region including the observation target defect on the sample wafer 108 with the electron beam 115, and the generated secondary electron 117 or the backscattered electron 118 is detected by the detector 111, thereby imaging the relatively large region including the observation target defect. A detection signal output from the detector 111 which is obtained through the imaging is processed by the detector control unit 203 so as to acquire the low magnification image of the relatively wide region including the observation target defect (S1303).

In the detector control unit 203, image preprocessing (S1304) such as noise removal is applied to the low magnification image acquired through the imaging in S1303 in the same way as described in Embodiment 1. Thereafter, a process the same as that in S1205 is performed so as to detect the defect site. (S1305).

Next, the enlarged image (degraded image) is generated by enlarging an image in a region including the defect site detected in S1305, that is, an image of a partial region including the defect site in the low magnification image in the relatively wide region which is acquired in S1302. Based on the estimation process parameter read from the estimation process parameter storage unit 206 of the storage unit 103, the high quality image estimation unit 207 of the arithmetic unit 104 estimates the high quality image from the enlarged image (degraded image) (S1306). This estimated high quality image is stored in the image storage unit 204 of the storage unit 103.

The above-described processes in S1302 to S1306 are repeatedly performed for all of the observation target defects of the sample wafer 1. For example, the observation target defect may be a defect detected in advance by an optical defect inspection device, or may be a defect designated by a user.

In addition, the learning sequence (S1203 to S1207) may be appropriately performed by a user's instruction through a GUI displayed on the display 1130 of the input/output terminal 113 of the user interface control unit 106.

Figure 14A:
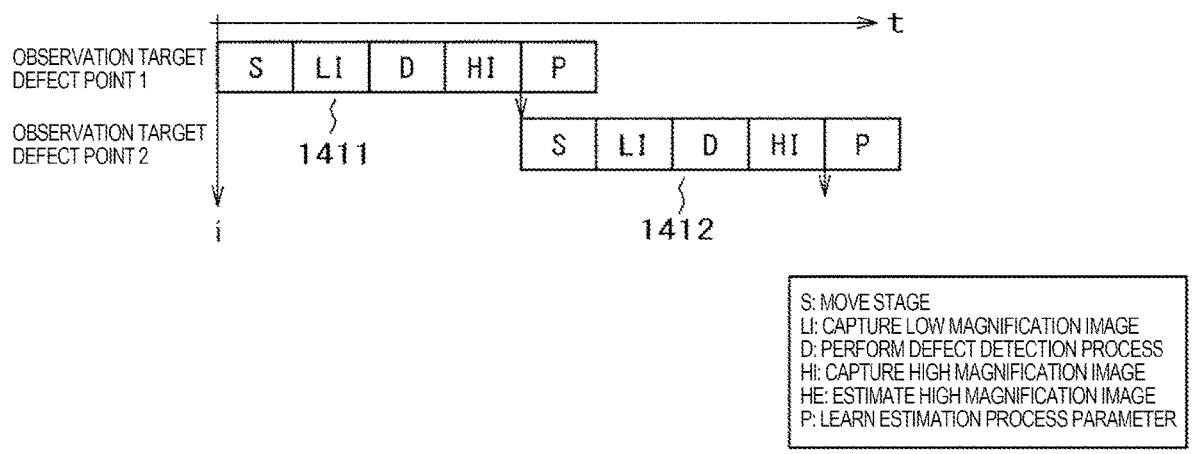
FIG. 14A is a timing chart of an automatic defect observation process in a sample observation device in the related art which is compared with the sample observation device according to Embodiment 2 of the present invention.

FIG. 14A illustrates a timing chart of each process in a case where the observation target defects (1) and (2) are sequentially and automatically observed in the learning sequence described in FIG. 12. A horizontal axis represents the time, and a vertical axis represents the observation target defect.

In the learning sequence, first, in Step 1411, the stage is moved to the region including the observation target defect (1) (S), the relatively wide region including the observation target defect (1) is imaged by the SEM 101 so as to acquire the low magnification image in the relatively wide region including the observation target defect (1) (LI). This low magnification image is processed so as to detect the defect (D), and the high magnification image (high quality image) in a relatively narrow region including the detected defect is acquired (HI). The estimation process parameter is learned using the enlarged image (degraded image) generated by partially enlarging the low magnification image and the high magnification image (high quality image) (P).

Next, in Step 1412, it is necessary to move the stage in order to image the region including the observation target defect (2).

After the low magnification image is acquired (LI) by imaging the region including the observation target defect (1) (hereinafter, referred to as the observation target defect (1)) in Step 1411, the defect is detected (D). The observation target defect (1) remains within the imaging visual field of the SEM 101 until the high magnification image of the observation target defect (1) is completely captured (HI). That is, stage movement S for imaging the observation target defect (2) in Step 1412 is made after the high magnification image is completely captured (HI).

Figure 14B:
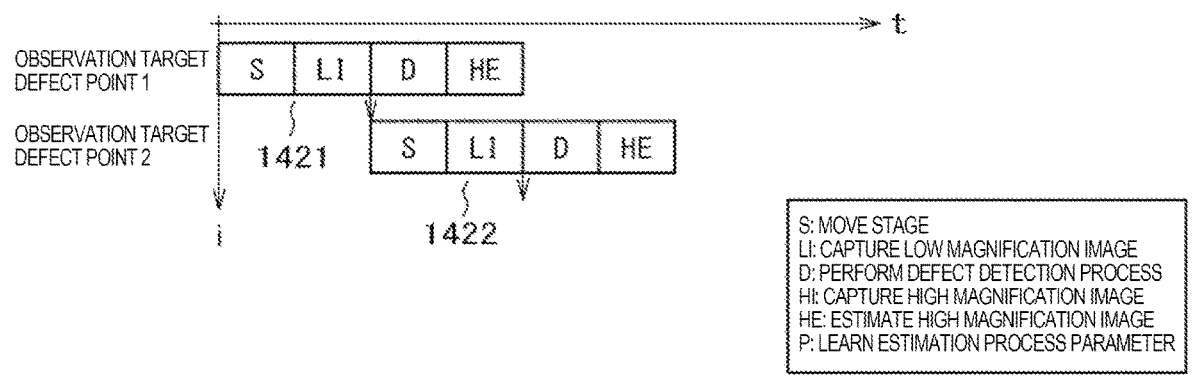
FIG. 14B is a timing chart of the automatic defect observation process in the sample observation device according to Embodiment 2 of the present invention.

On the other hand, FIG. 14B illustrates a timing chart of each process in a case where the observation target defects (1) and (2) are sequentially and automatically observed according to the present embodiment described with reference to FIG. 13. A relationship between the horizontal axis and the vertical axis is the same as that in the case of FIG. 14A.

In a sequence of automatic defect observation, the enlarged image generated by enlarging the image of the partial region including the defect in the low magnification image acquired in capturing the low magnification image (LI) in step 1421 is regarded as the degraded image. The high magnification image is estimated as the high quality image in estimating the high magnification image (HE) in Step 1421. In this manner, it is not necessary to provide a process of capturing the high magnification image (HI) in Step 1411 of the learning sequence described in FIG. 14A.

In this manner, in Step 1421, if the low magnification image is completely captured (LI) for the observation target defect (1), the observation target defect (1) on the sample wafer 108 does not need to remain within the imaging visual field of the SEM 101. Accordingly, the stage movement (S) can be made to a defect point coordinate of the subsequent observation target defect (2) in Step 1422.

That is, as illustrated in FIG. 14B, a defect detection process (D) and a high magnification image estimation process (HE) of the observation target defect (1) in Step 1421, and the stage movement (S) to the observation target defect (2) in Step 1422 and the low magnification imaging process (LI) can be performed in parallel with each other. In this manner, it is possible to improve the throughput in a case where a plurality of defects of the observation target on the sample wafer 108 are sequentially observed using the defect observation device.

Figure 15A:
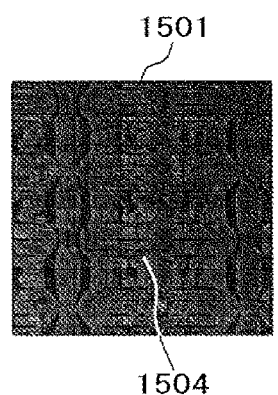
FIG. 15A is a view illustrating image processing in the sample observation device according to Embodiment 2 of the present invention, and is a view of a low magnification image.
Figure 15B:
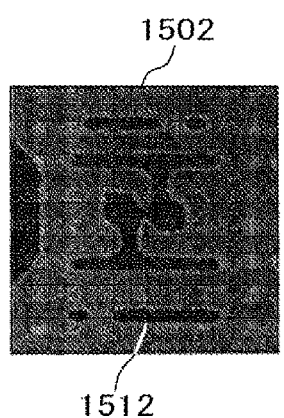
FIG. 15B is a view illustrating image processing in the sample observation device according to Embodiment 2 of the present invention, and is an enlarged image view obtained by partially enlarging the low magnification image.
Figure 15C:
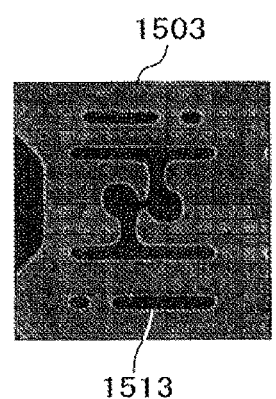
FIG. 15C is a view illustrating image processing in the sample observation device according to Embodiment 2 of the present invention, and is a view of a high magnification image corresponding to the enlarged image in FIG. 14B.

FIG. 15A illustrates an example of a low magnification image 1501 obtained through the imaging of the SEM 101, FIG. 15B illustrates an example of an enlarged image 1502 generated by enlarging a region 1504 corresponding to the imaging region of the high magnification image from the low magnification image 1501 in FIG. 15A by means of linear interpolation, and FIG. 15C illustrates an example of a high magnification image 1503 obtained through the imaging of the SEM 101.

In the enlarged image 1502 in FIG. 15B which is obtained by partially enlarging the low magnification image 1501 in FIG. 15A, an outline of a pattern 1512 is blurred, and this image is regarded as the degraded image. On the other hand, in the high magnification image 1503 in FIG. 15C, an outline of a pattern 1513 is clear, and this image is regarded as the high quality image. The degraded image (enlarged image) 1502 and the high quality image (high magnification image) 1503 are used so as to learn the estimation process parameter by using the method described in the learning sequence S304 according to Embodiment 1, and a correspondence relationship is learned. In this manner, it is possible to estimate the high magnification image from the enlarged image generated by partially enlarging the low magnification image.

As a process corresponding to the learning objective image pair collection in S401 according to Embodiment 1, a timing chart is performed as follows. After the high magnification imaging process (HI) of the observation target defect (1) as the process flow in FIG. 12 is illustrated in FIG. 14A, the stage movement (S) is made so that the observation target defect (2) enters the imaging visual field of the SEM 101. In this manner, it is possible to collect the low magnification image and the high magnification image. Thereafter, in the estimation process parameter learning process (P), a region corresponding to the imaging region of the high magnification image is cut out from the low magnification image through image processing, and the estimation process parameter is learned for the image enlarged by means of linear interpolation. In this manner it is possible to generate the degraded image.

Embodiment 3

In Embodiment 1 and Embodiment 2, a method of estimating the high quality image from the degraded image has been described. More specifically, a method has been described in which the correspondence relationship between the images having different imaging conditions is learned for one imaging device as a target so as to estimate the high quality image from the degraded image. In Embodiment 3, a method will be described in which the image qualities are combined with each other between a plurality of defect observation devices.

In a manufacturing line of semiconductors, the plurality of defect observation devices are introduced in many cases. In this case, different types (models) of the device may be introduced. In this case, the obtained image quality varies due to a difference in configurations or characteristics of detectors between the types of the device. In addition, even in a case of the same type, the image quality may vary due to a delicate difference (device difference) in characteristics of a beam profile and the detector, in some cases. These cause a problem especially when dimensions of a circuit pattern are measured with high accuracy. That is, even in a case where the same site of the same sample is measured with the plurality of defect observation devices, different dimensions are measured due to the difference in the image qualities of the images acquired by the respective defect observation devices.

Figure 16:
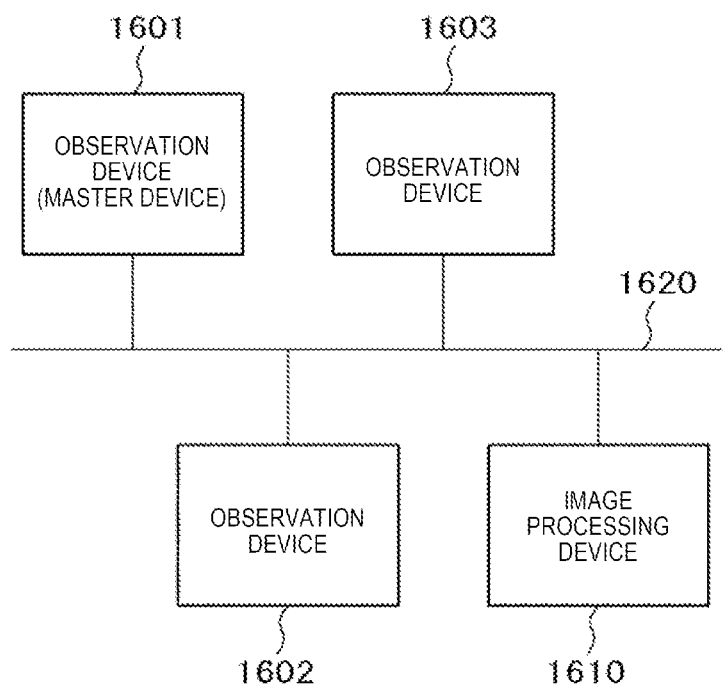
FIG. 16 is a block diagram illustrating a configuration in which a plurality of sample observation devices according to Embodiment 3 of the present invention are connected to each other by a network.

In order to solve this problem, it is possible to combine the image qualities of images with each other by using the method described in Embodiment 1. That is, as illustrated in FIG. 16, a defect observation device 1601 and a defect observation device 1602 respectively image the same site of the same sample. An image captured by the defect observation device 1601 may be regarded as the high quality image, and an image captured by the defect observation device 1602 may be regarded as the degraded image so as to learn the estimation process parameter.

In this manner, it is possible to estimate the image of the defect observation device 1601 from the image of the defect observation device 1602. In a case where three or more defect observation devices are present, the defect observation device to serve as a master device may be determined (in the example illustrated in FIG. 16, the defect observation device 1601 is set as the master device), and the other defect observation devices respectively obtain the image quality of the master device. In this way, each estimation process parameter may be learned.

In addition, the present embodiment can be applied to learning the estimation process parameter among the plurality of defect observation devices in mutually different production bases.

When the above-described method is performed, as illustrated in FIG. 16, a configuration may be adopted in which the respective defect observation devices 1601 to 1603 are connected to each other via a network 1620 so as to enable the image to be transmitted and received among the defect observation devices 1601 to 1603. The network 1620 is connected via the network interface unit 107 described in FIG. 1 according to Embodiment 1. The estimation process parameter may be learned in each of the defect observation devices other than the master device by the respective defect observation devices 1601 to 1603 receiving the image of the master device (defect observation device 1601).

Alternatively, an image processing device 1610 including the arithmetic unit 104 in FIG. 1 described in Embodiment 1 may be installed on the network, and the image processing device 1610 learns the estimation process parameter corresponding to the respective defect observation devices 1601 to 1603.

According to the above-described method, it is possible to adjust the image quality between the devices, and it is possible to reduce differences in measurement results which are caused by the device difference.

What is claimed is:

1. A system comprising:
a storage unit configured to store:
a first image of an first location on a first sample, the first image is imaged with a first imaging condition by a microscope; and
a second image of the first location, the second image is imaged with a second imaging condition which can be imaged with higher quality than the first imaging condition by the microscope;
a processor programmed to:
(1) calculate an estimation process parameter based on the first image and the second image;
(2) obtain a third image at a desired second location on the first sample or a second sample which is imaged with the first imaging condition; and
(3) estimate a fourth image of the desired second location based on the estimation process parameter and the third image.

2. The system according to claim 1,
wherein, while calculating the estimation process parameter, the processor is further programmed to:
(1a) calculate a difference between the second image and a fifth image estimated based on an initialized estimation process parameter and the first image;
(1b) set the initialized estimation process parameter to be the same as the estimation process parameter, if the difference is smaller than a predetermined threshold value.

3. The system according to claim 1,
wherein the first imaging condition and the second imaging condition include at least one of:
a number of added frames;
an image resolution;
a focus height of the microscope; and
a time required from when a sample stops moving until the microscope starts to observe a sample.

4. The system according to claim 1, further comprising:
a controller controlling the microscope.

5. The system according to claim 4,
wherein, during (3) estimating the fourth image, the controller makes the microscope move a position of a table for a sample so that other location of the sample is entered in a visual field of the microscope.

6. A system comprising:
a storage unit configured to store:
a learning-purpose low magnification image of an first region on a first sample, imaged by a microscope; and
a learning-purpose high magnification image of a part of the first region, imaged by the microscope, and
a processor programmed to:
(A) generate an enlarged image by enlarging a part of the learning-purpose low magnification image corresponding to the part of the first region;
(B) calculate an estimation process parameter based on the enlarged image and the learning-purpose high magnification image;
(C) obtain a low magnification image of a desired second region on the first sample or a second sample; and
(D) estimate a high magnification image of a part of the desired second region based on the estimation process parameter and the low magnification image of the desired second region obtained in (C).

7. The system according to claim 6,
wherein, while calculating the estimation process parameter, the processor is further programmed to:
(B1) calculate a difference between the learning-purpose high magnification image and an image estimated based on an initialized estimation process parameter and the learning-purpose low magnification image;
(B2) set the initialized estimation process parameter to be the same as the estimation process parameter, if the difference is smaller than a predetermined threshold value.

8. The system according to claim 6, further comprising:
a controller controlling the microscope.

9. The system according to claim 8,
wherein, during (D) estimating the second high magnification image, the controller makes the microscope move a position of a table for a sample so that other location of the sample is entered in a visual field of the microscope.

10. A system comprising:
a storage unit configured to store:
a first image of a first sample, imaged by at least one first microscope; and
a second image of the first sample, imaged by a second microscope;
a processor programmed to:
(i) calculate an estimation process parameter based on the first image and the second image;
(ii) obtain a third image of the first sample or a second sample, imaged by the at least one first microscope; and
(iii) estimate a fourth image of the first sample or the second sample, based on the estimation process parameter and the third image.

11. The system according to claim 10,
wherein at least one first microscope is a plural first microscopes.

12. The system according to claim 11,
wherein the estimation process parameter includes parameters for each of the plural first microscopes.

13. The system according to claim 12,
wherein each of the plural first microscopes is set in different production bases.

* * * * *